(12) United States Patent
Yen

(10) Patent No.: US 7,173,548 B2
(45) Date of Patent: Feb. 6, 2007

(54) METHOD AND RELATED APPARATUS FOR DIGITAL-ANALOG CONVERSION

(75) Inventor: Yung-Chih Yen, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 11/307,687

(22) Filed: Feb. 17, 2006

(65) Prior Publication Data

US 2006/0192703 A1  Aug. 31, 2006

Related U.S. Application Data

(60) Provisional application No. 60/593,825, filed on Feb. 17, 2005.

(51) Int. Cl.
*H03M 1/66* (2006.01)

(52) U.S. Cl. ...................................... 341/118; 341/144

(58) Field of Classification Search ................ 341/143, 341/144, 118, 117, 119, 131
See application file for complete search history.

(56) References Cited

U.S. PATENT DOCUMENTS

| | | | | |
|---|---|---|---|---|
| 4,306,222 A | * | 12/1981 | Peek et al. ................... | 341/118 |
| 5,608,401 A | * | 3/1997 | Viswanathan et al. ....... | 341/144 |
| 6,218,974 B1 | * | 4/2001 | Dedic .......................... | 341/144 |
| 6,278,390 B1 | * | 8/2001 | Meyer et al. ................ | 341/118 |
| 6,344,810 B2 | * | 2/2002 | Velazquez .................... | 341/118 |
| 6,693,571 B2 | * | 2/2004 | Melanson et al. ........... | 341/143 |
| 6,762,704 B1 | * | 7/2004 | Melanson et al. ........... | 341/143 |
| 6,809,669 B1 | * | 10/2004 | Robinson ..................... | 341/131 |

* cited by examiner

*Primary Examiner*—Jean Bruner Jeanglaude
(74) *Attorney, Agent, or Firm*—Winston Hsu

(57) ABSTRACT

Method and related apparatus for digital/analog converter are disclosed. The invention is based on M switch elements with each capable of selectively providing a positive or a negative electricity. While generating an analog signal output corresponding to a digital input of value D, the invention calculates two values Pa and Na according to these two equations: Pa−Na=D; Pa+Na=M, (M−1) or (M+1), and then Pa switch elements are made to respectively provide positive electricity with Na switch elements respectively providing negative electricity, such that the analog signal output is synthesized. Because the invention can perform error shaping for imbalance positive/negative electricity within each switch element, and for mismatch between the switch elements, the invention works well for over-sampling A/D converter system.

20 Claims, 6 Drawing Sheets

| Digital input D | Combination of positive/negative electricity (M=8)<br>Pa: Numbers of positive units    Na: Numbers of negative units | | | | |
|---|---|---|---|---|---|
| 8 | 8=8-0:Pa=8, Na=0 | | | | |
| 7 | 7=8-1:Pa=8, Na=1 | 7=7-0:Pa=7, Na=0 | | | |
| 6 | 6=7-1:Pa=7, Na=1 | | | | |
| 5 | 5=7-2:Pa=7, Na=2 | 5=6-1:Pa=6, Na=1 | | | |
| 4 | 4=6-2:Pa=6, Na=2 | | | | |
| 3 | 3=6-3:Pa=6, Na=3 | 3=5-2:Pa=5, Na=2 | | | |
| 2 | 2=5-3:Pa=5, Na=3 | | | | |
| 1 | 1=5-4:Pa=5, Na=4 | 1=4-3:Pa=4, Na=3 | | | |
| 0 | 0=4-4:Pa=4, Na=4 | | | | |
| -1 | -1=4-5:Pa=4, Na=5 | -1=3-4:Pa=3, Na=4 | | | |
| -2 | -2=3-5:Pa=3, Na=5 | | | | |
| -3 | -3=3-6:Pa=3, Na=6 | -3=2-5:Pa=2, Na=5 | | | |
| -4 | -4=2-6:Pa=2, Na=6 | | | | |
| -5 | -5=2-7:Pa=2, Na=7 | -5=1-6:Pa=1, Na=6 | | | |
| -6 | -6=1-7:Pa=1, Na=7 | | | | |
| -7 | -7=1-8:Pa=1, Na=8 | -7=0-7:Pa=0, Na=7 | | | |
| -8 | -8=0-8:Pa=0, Na=8 | | | | |

Fig. 4

METHOD AND RELATED APPARATUS FOR DIGITAL-ANALOG CONVERSION

CROSS REFERENCE TO RELATED APPLICATIONS

The application claims the benefit of U.S. Provisional Application No. 60/593,825, filed Feb. 17, 2005, and included herein by reference.

BACKGROUND OF THE INVENTION

1. Field of the Invention

The invention provides a method and related apparatus for digital-analog conversion, and more particularly, a digital-analog conversion system for achieving better dynamic element matching in an over-sampling D/A converter.

2. Description of the Prior Art

Due to the advancing techniques of semiconductor, a variety of information, data, characters, and audio data are capable of being processed and delivered quickly. Various electrical circuits for signal processing become essential hardware of today's information society. Digital-analog converter systems capable of converting digital signals into analog signals have found a myriad of applications in many electrical circuits produced for communication, audiovisuals, and hi-fi equipment uses.

D/A converter systems are divided into two classes: Nyquist sampling rate D/A converter systems and over-sampling D/A converter systems. As known, an ideal sampling rate (Nyquist sampling rate) is at least greater than twice the signal frequency when sampling. This is the so-called sampling law. A D/A converter system designed based on this sampling rate is called a Nyquist D/A converter system. However, sigma-delta converters, which are developing quickly recently, is an over-sampling D/A converter system. In this kind of system, a sampling rate is further greater than that in the Nyquist sampling rate D/A converter system.

Generally speaking, a D/A converter system includes a core digital-analog circuit and related converter control logic for generating a corresponding analog output according to a digital input. The digital-analog circuit includes a plurality of switch elements capable of selectively supplying a unit of electricity or not. While generating a corresponding analog output, the numbers of switch elements which are turned on are determined according to the digital input. For example, if the digital input is a binary 011 (which equals three), then three switch elements are turned on and the others are turned off to supply three units of electricity as the analog output of the digital-analog circuit.

In some digital-analog applications, the value of digital input is positive or negative. Correspondingly, in such digital-analog applications, each switch element is capable of selectively supplying a unit of positive electricity or a unit of negative electricity or neither to represent the digital value of +1, −1, or 0 respectively. In the prior art, if the digital input is +4, the digital-analog circuit turns on four switch elements for supplying a total of four units of positive electricity; if the digital input is −2, the digital-analog circuit turns on two switch elements for supplying a total of two units of negative electricity. The switch elements are called three-level switch elements due to being capable of selectively supplying a unit of positive electricity or a unit of negative electricity or no electricity.

Three-level switch elements are realized practically by using switch capacitors or positive/negative current source techniques. In the switch capacitor technique, the switch elements include a capacitor for selectively supplying a unit of positive electricity or a unit of negative electricity or no electricity. In the positive/negative current source technique, the switch elements include two current sources for supplying a two-way current. One current source is connected and the other is disconnected for selectively supplying a unit of positive electricity or a unit of negative electricity, and both current sources are connected or disconnected for supplying no electricity. However, no matter what technique is applied in such digital-analog circuits, there are still mismatches between switch elements. Each switch element in the digital-analog circuit supplies a unit of positive electricity or negative electricity in an ideal condition, but different switch elements practically supply different electricity causing mismatch due to manufacturing differences. For example, in actuality one switch element may supply 1.05 units of electricity and another may supply 0.98 units of electricity, making the electricity of the compound analog output unequal to the ideal value and thus causing a mismatch.

Besides mismatch error, the switch elements still have gain error. Generally speaking, there is mismatch between the positive and negative electricity provided by each three-level switch element. Ideally, each three-level switch element is capable of selectively supplying a unit of positive electricity or a unit of negative electricity. But in practice, even the positive or negative electricity provided by the same switch element are marginally different. For example, one three-level switch element supplies 1.02 units of positive electricity but merely supplies 0.96 units of negative electricity, thus causing gain error. When the switch element supplies 1.02 units of positive electricity according to the digital input value of +1, the gain error is 1.02/1; but when the switch element supplies 0.96 units of negative electricity according to the digital input value of −1, the gain error is 0.96/1. This represents that the switch element has gain error when supplying electricity according to positive or negative digital input. In the positive/negative current source technique, the three-level switch elements have bigger gain error. Because the positive and negative current sources are realized with different type of transistors (NMOS and PMOS) in the same switch element, it is difficult to reach a balance and match the positive and negative current sources.

With regard to the mismatch between the switch elements, some prior art already lower the effects. For example, when using an over-sampling D/A converter system, a known D/A converter circuit uses different switch elements to generate an analog output for reducing the mismatch effect between switch elements, which is so called dynamic element matching technique.

However, the prior art does not readily lower the gain error caused by the imbalance of each switch element's positive and negative electricity. Most D/A converter systems lower the mismatch between switch elements, but are unable to solve the gain error. This reduces the immunity against errors, so known digital-analog converter systems are unable to get a better signal-noise ratio (SNR).

SUMMARY OF THE INVENTION

The present invention provides a digital-analog converter system, including a common mode adjustment module, a pre-processing module, a digital-analog converter circuit and an assignment module. The common mode adjustment module determines a first value S according to a digital input D. The pre-processing module connects to the common mode adjustment module for determining number of positive units which are turned on (Pa) and number of negative units which are turned on (Na) according to the first value S and the digital input D. The digital-analog converter circuit includes M three-level switch elements, wherein each three-level switch element has a positive unit capable of supplying a unit of positive electricity and a negative unit capable of supplying a unit of negative electricity, the digital-analog converter circuit generates a corresponding analog output according to Pa and Na. The assignment module is connected to the pre-processing module and the digital-analog converter circuit for controlling the M three-level switch elements to supply positive or negative electricity in a predetermined order according to the first value S.

The present invention further provides a digital-analog converting method in a digital-analog converter system including M three-level switch elements. Each three-level switch element has a positive unit capable of supplying a unit of positive electricity and a negative unit capable of supplying a unit of negative electricity. The method includes the following steps. First, determining a first value S according to a digital input D. Then, determining number of positive units which are turned on (Pa) and number of negative units which are turned on (Na) according to the first value S and the digital input D. Next, controlling the M three-level switch elements to supply positive or negative electricity in a predetermined order according to the first value S. Finally, generating a corresponding analog output according to Pa and Na.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 shows a diagram of synthesizing various analog output signals with an amount of positive and negative electricity according to an embodiment of the present invention.

DETAILED DESCRIPTION

Figure 1:
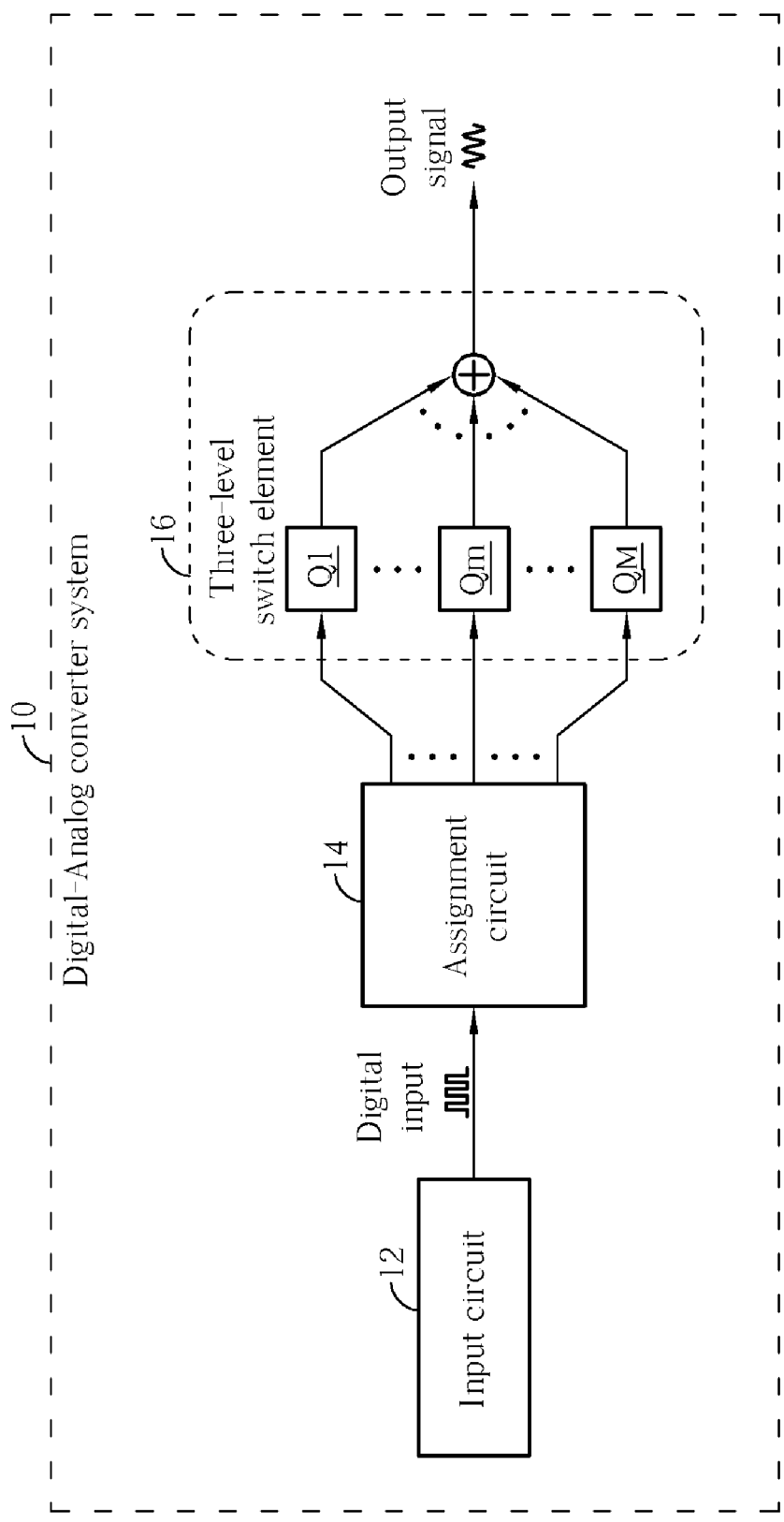
FIG. 1 is a block diagram of a typical digital-analog converter system.

Please refer to FIG. 1. FIG. 1 is a diagram illustrating a digital-analog converter system 10. The digital-analog converter system 10 includes an input circuit 12, an assignment circuit 14, and a D/A circuit 16. The D/A circuit 16 includes M three-level switch elements Q1 to QM capable of selectively supplying a unit of positive electricity or negative electricity or no electricity. The input circuit 12 supplies a digital input. The assignment circuit 14 is a controlling logic of D/A converting for generating a corresponding analog output according to the digital input of the input circuit 12.

Figure 2:
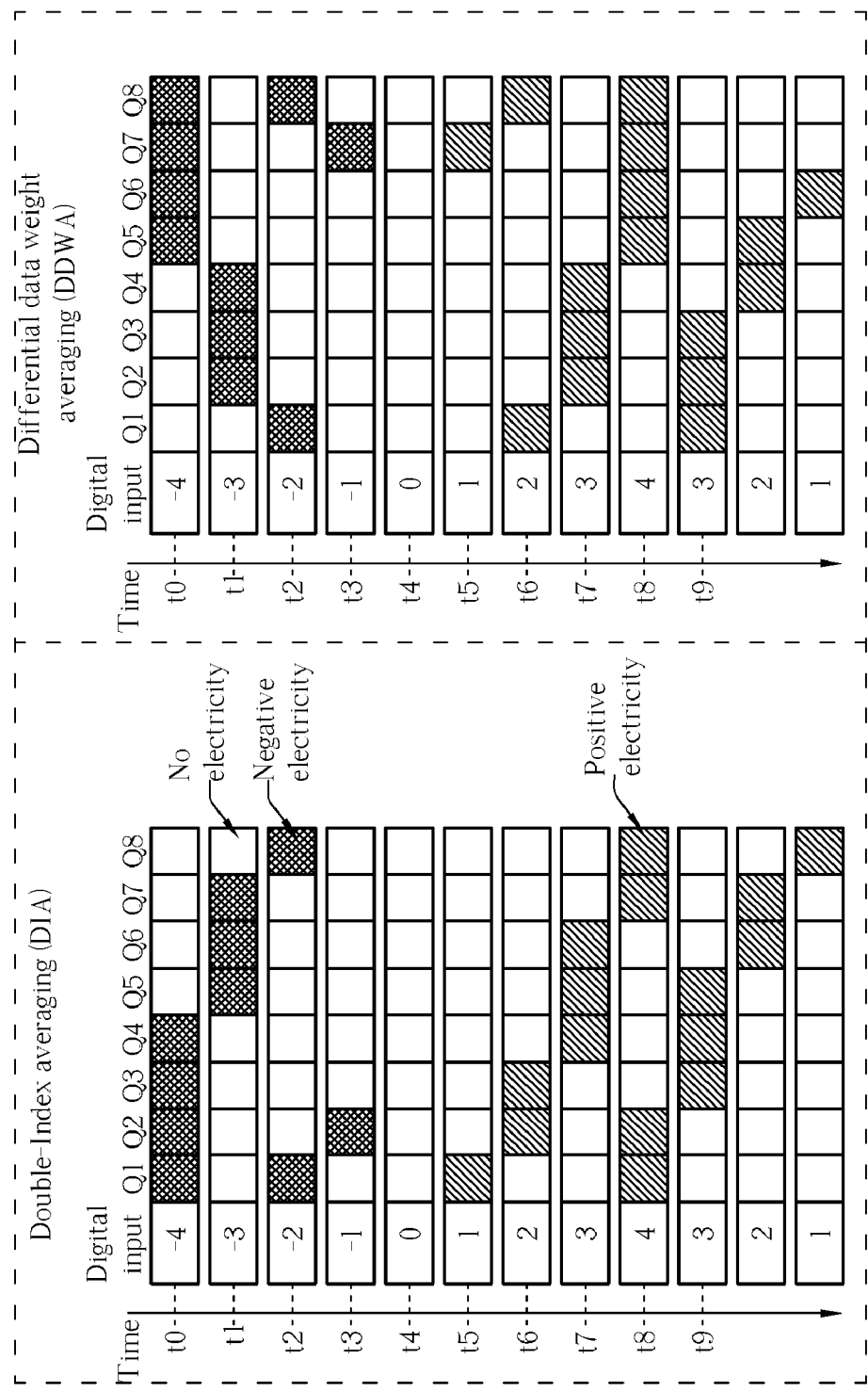
FIG. 2 shows a diagram illustrating the system of FIG. 1 processing typical dynamic element matching.

As mentioned, a dynamic element matching technique is used to generate analog outputs for lowering the mismatch between three-level switch elements. Please refer to FIG. 2. FIG. 2 illustrates two types of typical dynamic element matching techniques of the digital-analog converter system 10. The vertical axis in FIG. 2 is time, and there are eight three-level switch elements Q1 to Q8. When generating analog outputs according to corresponding digital inputs, switch elements for supplying positive electricity are shown as single-hatched blocks, those for supplying negative electricity are shown as cross-hatched blocks, and those for supplying no electricity are shown as white blocks.

The left portion of FIG. 2 illustrates a double-index averaging (DIA) dynamic element matching technique. The method uses two independent queues to assign which switch elements supply positive electricity and which switch elements supply negative electricity. As shown in the left portion of FIG. 2, when the digital input is −4, the assignment circuit 14 appoints switch elements Q1–Q4 to supply negative electricity at time t0. At time t1, when the digital input is −3, the assignment circuit 14 appoints switch elements Q5–Q7 substituted for switch elements Q1–Q4 to supply negative electricity. At time t2, when the digital input is −2, the sequential switch elements Q8 and Q1 are appointed to supply negative electricity. At time t3, when the digital input is −1, the sequential switch element Q2 is appointed to supply negative electricity.

At time t5, when the digital input is 1, one switch element is appointed to supply positive electricity. Due to DIA dynamic element matching arranging the switch elements for supplying positive and negative electricity independently, the switch element Q1 is appointed to supply positive electricity at time t5. At time t6, when the digital input is 2, the sequential switch elements Q2–Q3 are appointed to supply positive electricity. At time t7, when the digital input is 3, the sequential switch elements Q4–Q6 are appointed to supply positive electricity.

In other words, if the preceding digital input D is a negative value and the DIA dynamic element matching arranges some switch elements to supply negative electricity, on a next negative digital input D the DIA dynamic element matching arranges other switch elements to substitute for the former to supply negative electricity alternately. If the preceding digital input D is a positive value and the DIA dynamic element matching arranges some switch elements to supply positive electricity, on a next positive digital input D the DIA dynamic element matching arranges other switch elements to substitute for the former to supply positive electricity alternately.

The right portion of FIG. 2 illustrates the practicality of differential data weight averaging (DDWA). The dynamic element matching method arranges the rotation of switch elements for supplying positive and negative electricity in different directions. The switch elements for supplying positive electricity alternate by increasing index progressively, such as the sequence Q1, Q2, and Q3. The switch elements for supplying negative electricity alternate by decreasing index progressively, such as the sequence Q8, Q7, and Q6. As shown in the right portion of FIG. 2, when the digital input is −4, the DDWA dynamic element matching arranges switch elements Q8–Q5 to supply negative electricity at time t0. At time t1, when the digital input is −3, the sequential switch elements Q4–Q2 are appointed to supply negative electricity by decreasing index progressively. At time t2, when the digital input is a negative number, −2, the sequential switch elements Q8 and Q1 are appointed to supply negative electricity.

At time t5, when the digital input is a positive number +1, the DDWA dynamic element matching arranges switch element Q7 to supply positive electricity in place of switch element Q6 by increasing index progressively. At time t6, when the digital input is +2, the DDWA dynamic element matching arranges switch elements Q8 and Q1 to supply positive electricity. At time t7, when the digital input is still a positive number, the sequential switch elements Q2–Q4 are appointed to supply positive electricity.

As shown in FIG. 2, the corresponding analog outputs are generated by different switch elements even though the digital input values are the same at different times. In FIG. 2, both the digital input values are 3 at time t7 and t9, but the corresponding analog outputs are generated by different switch elements whether in DIA or DDWA. Analog outputs are generated with different switch elements when processing a series of digital inputs, which lowers the mismatch between switch elements. In an over-sampling digital-analog converter system, dynamic element matching transforms the mismatch into high-frequency noise for lowering the effect of mismatch.

As mentioned before, besides the mismatch between switch elements, there are still gain errors between switch elements. Gain errors are difficult to be reduced by the dynamic element matching technology of FIG. 2, because that technology does not consider the balance of no electricity. Assume that a switch element is capable of supplying positive electricity of Ip and negative electricity of –In. The ideal balance of positive and negative electricity is 0 when Ip equals In. In fact, even in the same switch element, the positive electricity and negative electricity do not match completely. The balance electricity (Ip–In)/2 is not equal to no electricity, that is, 0. If the positive electricity Ip is 1 and the negative electricity –In is –1, then the value between +1 and –1 is represented by (Ip–In)/2. In FIG. 2, these two typical technologies have no solution to gain error.

Figure 3:
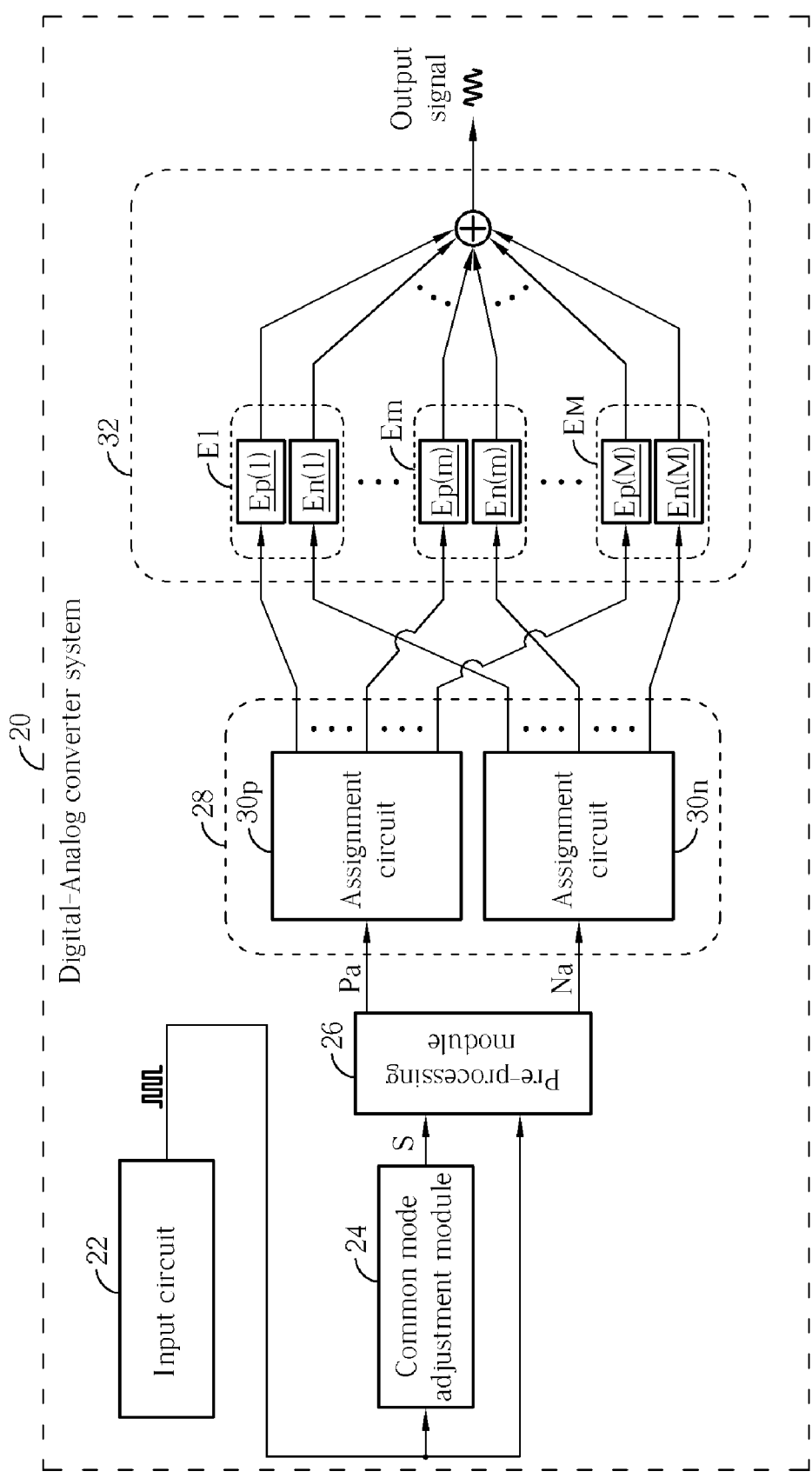
FIG. 3 is a block diagram of a digital-analog converter system according to an embodiment of the present invention.

Please refer to FIG. 3. FIG. 3 is block diagram showing an embodiment of a digital-analog converter system 20 of the present invention. The digital-analog converter system 20 includes an input circuit 22 and a D/A circuit 32. The input circuit 22 supplies a digital input being a positive or negative value. The D/A circuit 32 includes M three-level switch elements E1–EM. In the embodiment of the present invention, each switch element Em is capable of selectively supplying or not supplying one unit of positive or negative electricity. As shown in FIG. 3, the switch element Em is equivalent to a positive unit Ep(m) for supplying or not supplying a unit of positive electricity, and a negative unit En(m) for supplying or not supplying a unit of negative electricity. Turning on or off the positive unit Ep(m) and negative unit En(m) individually make the switch element Em supply a unit of positive electricity of +1, a unit negative electricity of –1, enable common-mode electricity of 0, or disable common-mode electricity of 0. The switch elements are realized with positive and negative current sources. All electricity of switch elements E1–EM are combined to generate an analog output.

The digital-analog converter system 20 further includes a common mode adjustment module 24, a pre-processing module 26, and an assignment module 28, wherein the common mode adjustment module 24 and the pre-processing module 26 synthesize an adjustment circuit. When converting a digital input D into an analog output, the common mode adjustment module 24 determines a first value S according to D. The pre-processing module 26 calculates the values of Pa and Na according to these two equations: Pa+Na=S, Pa–Na=D. Pa represents the number of positive units which is turned on for supplying Pa units of positive electricity, and Na represents the number of negative units which is turned on for supplying Na units of negative electricity. Because Pa–Na=D, Pa units of positive electricity are combined with Na units of negative electricity to generate a corresponding analog output.

As mentioned before, Pa–Na=D is a requirement for generating an analog output according to a digital input D. S=Pa+Na has some flexibility. Please refer to FIG. 3, and assume that M is an even number. When D is even, S=M; and when D is odd, S=(M–1) or (M+1). When converting a series of digital inputs into analog outputs, if a preceding digital input D is an odd number and the first value S is M–1, on a next odd digital input D the first value S is M+1; or if the preceding digital input D is an odd number and the first value S is M+1, on a next odd digital input D the first value S is M–1. Alternately choosing S=M–1 and S=M+1 for consecutive odd values of input D to supply no electricity makes the value 0 equal the balance electricity for lowering the gain error.

After the pre-processing module 26 determines the value of Pa and Na according to the values of D and S, the assignment module 28 decides which Pa positive units and which Na negative units to turn on. In the embodiment of FIG. 3, the assignment module 28 includes two independent assignment circuits 30$p$ and 30$n$. The assignment circuit 30$p$ turns on or turns off the positive units in a pre-determined order for supplying positive electricity while converting a series of digital inputs into analog outputs; and the assignment circuit 30$n$ turns on or turns off the negative units in a pre-determined order for supplying negative electricity while converting a series of digital inputs into analog outputs.

In other words, the assignment circuit 30$p$ and 30$n$ use different positive units and negative units to supply electricity for lowering the effect of the mismatch between switch elements. The common mode adjustment module 24 reduces the gain error caused by the mismatch between positive units and negative units. The present invention is capable of lowering the effects of mismatch and gain error.

Figure 5:
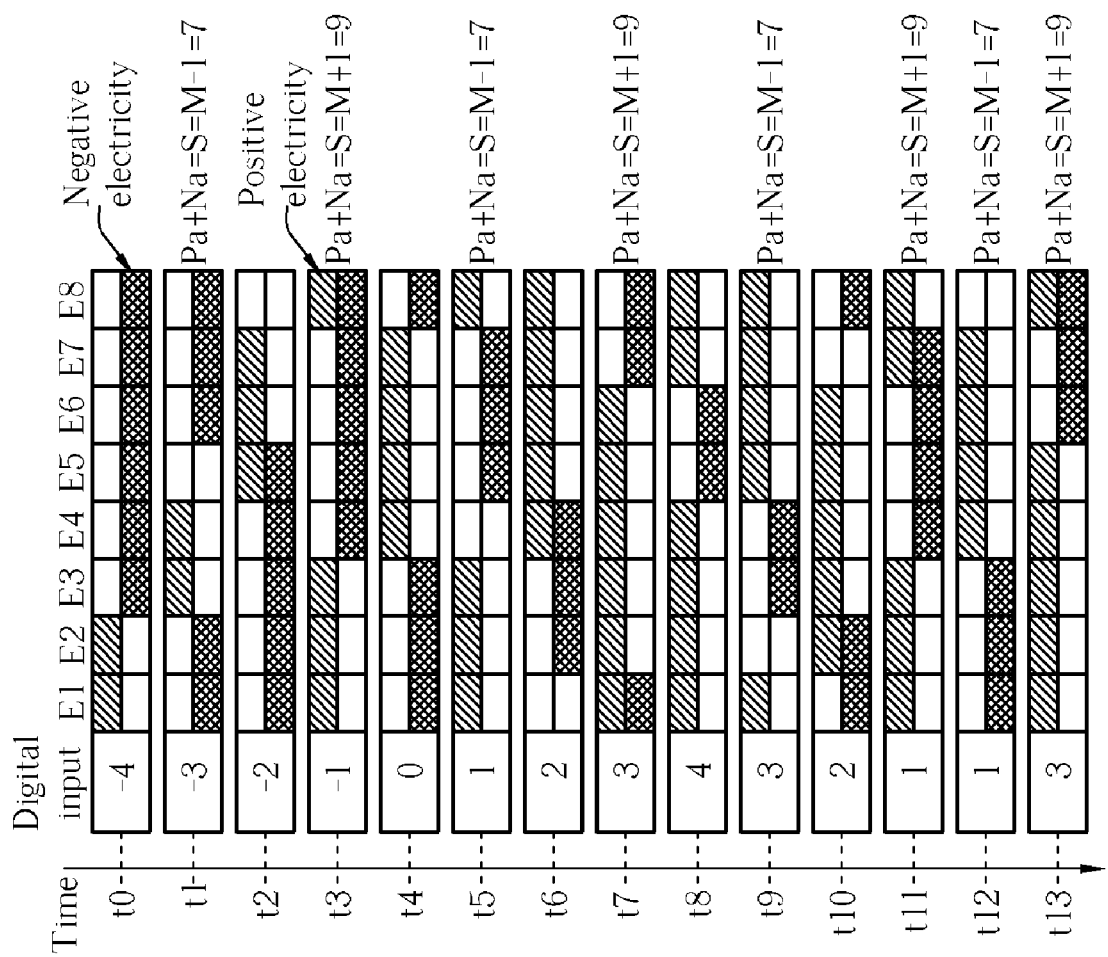
FIG. 5 shows a diagram illustrating a system of FIG. 3 converting a series of digital inputs into analog outputs sequentially.

Take M=8, for example. Please refer to FIG. 4 and FIG. 5. FIG. 4 illustrates using eight switch elements to determine the values Pa and Na according to the digital input D. FIG. 5 shows an example to describe the operation of turning on and turning off these eight positive and negative units. The vertical axis of FIG. 5 is time.

As shown in FIG. 4, when the digital input D is an even number 8, (Pa,Na)=(8,0) generates a corresponding analog output. When the digital input is 6, (Pa,Na)=(7,1) generates a corresponding analog output. The values Pa and Na are calculated from Pa+Na=8. By contrast, when the digital input is an odd number, there are two combinations for (Pa,Na): Pa+Na=M+1 and Pa+Na=M–1. When the digital input is 7, (Pa,Na) is (8,1) or (7,0); and when the digital input is –3, (Pa,Na) is (3,6) or (2,5).

In FIG. 5, each switch element E1–E8 is represented by one grid element representing the positive unit and another grid element representing the negative unit. When generating analog outputs, switch elements for supplying positive electricity are single-hatched, those for supplying negative electricity are cross-hatched, and those for supplying no electricity are white. As shown in FIG. 5, at time t0, when the digital input is –4, (Pa,Na)=(2,6) turns on two positive units and six negative units for generating a corresponding analog output. The assignment circuit 30$p$ appoints switch elements E1 and E2 to supply positive electricity, and the assignment circuit 30$n$ appoints switch elements E3–E8 to supply negative electricity. At time t1, when the digital input is an odd number, –3, the pre-processing module 26 sets (Pa,Na)=(2,5) according S=M−1. In the embodiment of FIG. 5, the assignment circuit 30p appoints switch elements E3–E4 to supply positive electricity by increasing index progressively, and the assignment circuit 30n appoints switch elements E2, E1, E8, E7 and E6 to supply negative electricity by decreasing index progressively.

At time t2, when the digital input is −2, the pre-processing module 26 sets (Pa,Na)=(3,5) according to S=M. The assignment circuit 30p appoints switch elements E5–E7 to supply positive electricity by increasing index progressively, and the assignment circuit 30n appoints switch elements E5–E1 to supply negative electricity by decreasing index progressively. At time t3, the digital input is an odd number −1, and the pre-processing module 26 sets (Pa,Na)=(4,5) according to S=M+1 due to the preceding odd digital input D being the first value S=M−1. Then, the assignment circuit 30p appoints switch elements E8, E1, E2, and E3 to supply positive electricity by increasing index progressively, and the assignment circuit 30n appoints switch elements E8–E4 to supply negative electricity by decreasing index progressively.

As shown in FIG. 5, every time processing an odd input, the present invention exchanges S=M−1 or S=M+1 alternately. At time t11 and t12, the digital inputs are both +1. At time t11, (Pa,Na)=(5,4) according to S=M+1; but at time t12, (Pa,Na)=(4,3) according to S=M−1. In conclusion, some three-level switch elements supply units of positive electricity and other three-level switch elements supply units of negative electricity at the same time, however, the sum of units of positive electricity and units of negative electricity is equal to the corresponding digital input D in different time.

When one unit of positive electricity Ip mismatches one unit of negative electricity −In, the balance electricity (Ip−In)/2 represents the value 0. Switch elements only provide the enable common-mode electricity (Ip−In) or the disable common-mode electricity 0 as the value 0. For lowering the gain error, the enable common-mode electricity or the disable common-mode electricity is used as the value 0 alternately. In the embodiment of FIG. 5, the present invention is capable of balancing the apparent frequency of the enable common-mode electricity and the disable common-mode electricity. For example, at time t0, when the digital input is −4, all switch elements supply a unit of electricity only, and no switch elements supply the enable common-mode electricity or the disable common-mode electricity. At time t2, when the digital input is −2, the switch element E8 turns off both positive and negative units for supplying the disable common-mode electricity as the value 0, and the switch element E5 turns on both positive and negative units for supplying the enable common-mode electricity as the value 0.

If the digital input is odd, a long-term average is used to balance the enable common-mode electricity and the disable common-mode electricity. At time t1, when the digital input is an odd number, −3, the switch element E5 uses disable common-mode electricity as value 0; but at time t3, when the digital input is a next odd number, the switch element E8 uses enable common-mode electricity as value 0 for balancing the preceding disable common-mode electricity. At time t5, when the digital input is an odd number, 1, the switch element E4 uses disable common-mode electricity as value 0; but at time t7, when the digital input is a next odd number, the switch element E1 uses enable common-mode electricity as value 0 for balancing the preceding disable common-mode electricity. For lowering the gain error, the enable common-mode electricity or the disable common-mode electricity is used as the value 0, alternately.

The present invention works well in an over-sampling digital-analog converter system. In an over-sampling digital-analog converter system, the sampling rate of a signal is much higher than the frequency of the signal. Alternating the disable common-mode electricity and the enable common-mode electricity with a high sampling rate converts the gain error into high-frequency noise, which is out of the bandwidth of the signal. The assignment circuit 30p and 30n appoint different switch elements to supply electricity. Then, the mismatch between switch elements is converted into high-frequency noise. Therefore, the present invention works well in a digital-analog converter system for raising the SNR and lowering the effect caused by gain error and mismatch.

Figure 6:
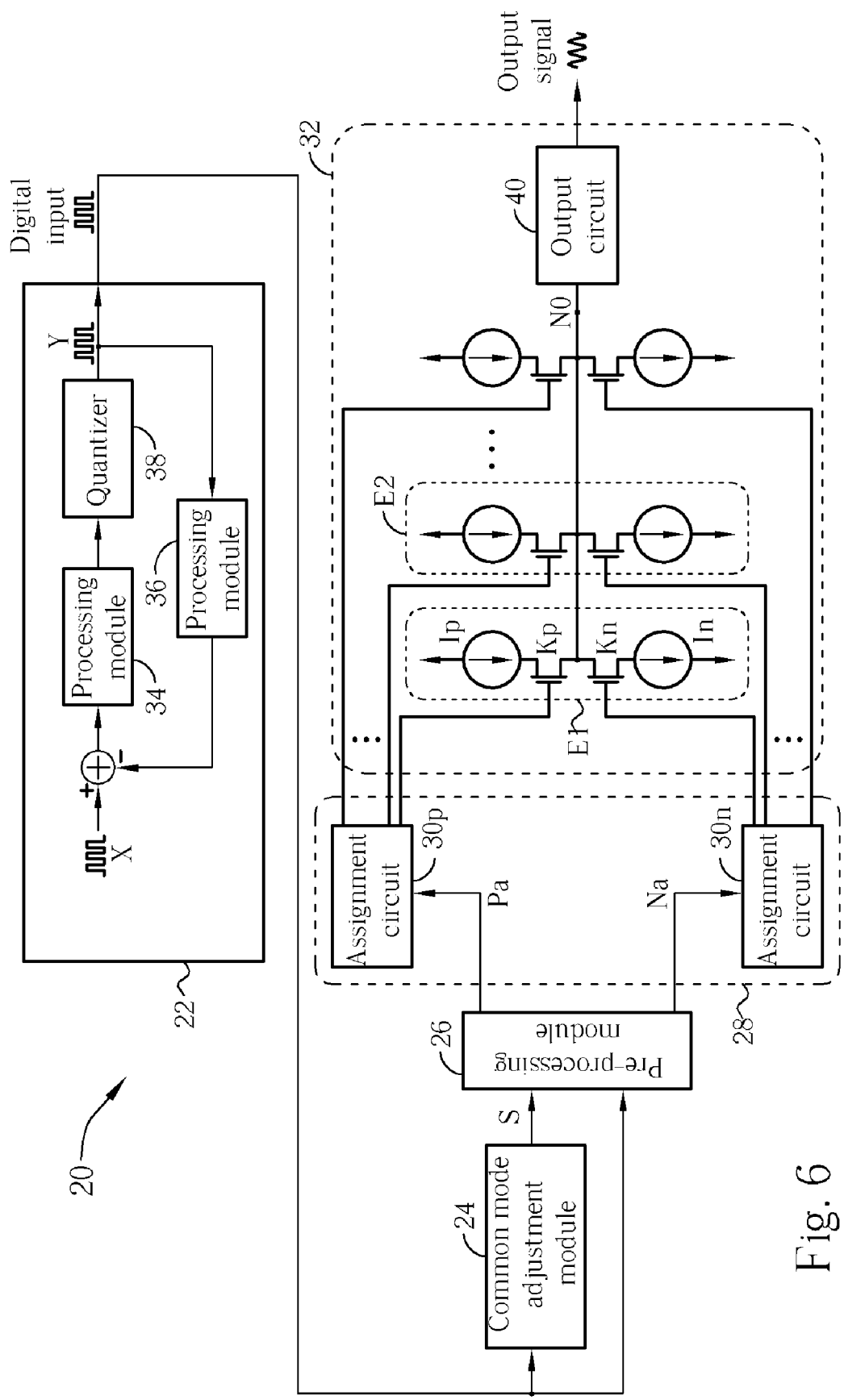
FIG. 6 shows a diagram of realizing an over-sampling D/A converter system of FIG. 3.

Please refer to FIG. 6 and FIG. 5. FIG. 6 is a diagram that shows a realization of the over-sampling D/A converter system 20 in FIG. 5. As shown in FIG. 6, the input circuit 22 is a sigma-delta converter, including two processing modules 34 and 36, and a quantizer 38. The processing module 34 is a loop filter, such as an integrator; and the processing module 36 is a gain adjustment circuit or other essential circuit. Inside the input circuit 22, the output signal Y of the quantizer 38 is fed back via the processing module 36 and then subtracted from the signal X. The result of the subtraction is accumulated with the processing module 34. The signal Y is compensated through the feedback path for tracking the variation of the signal X continually. The signal Y is a digital input of the digital-analog circuit 32. FIG. 6 shows an embodiment of a digital-analog converter circuit. Each switch element E1–En includes a positive current source, a negative current source, and two transistors Kp and Kn as switches. The positive current source supplies a current Ip through Kp to the node N0 as positive electricity, and the negative current source supplies a reverse current In through Kn to the node N0 as negative electricity. Turning on or off the transistors Kp and Kn supplies positive electricity, supplies negative electricity, enables common-mode electricity, or disables common-mode electricity. The output circuit 40 is an operational amplifier for collecting all electricity to generating analog outputs.

According to further data analysis, the signal-noise ratio in the present invention is improved 20 to 30 dB in comparison to the prior art. The present invention is capable of reducing the gain error and mismatch error to first-order error for lowering the effects of the errors. The so-called first-order error is that the present invention makes the gain error and mismatch error become 9 dB/octave high-frequency noise in a double-exponential power spectrum. The gain error and the mismatch error are transformed into high frequency errors, distributed apart from the bandwidth of signal, resulting in a better signal-noise ratio and an increased linearity of D/A converting. Furthermore, the present invention is realized by a simple circuit that increases the capability of the digital-analog converter system with lower cost. The assignment circuits 30p and 30n in FIG. 3 follow the assignment circuit of DDWA. Each function block in FIG. 3 is realized with hardware or firmware. For example, the common-mode adjustment module 24 is a simple register. When the digital input is odd, +1 and −1 are interchanged as S=M+1 or S=M−1. The pre-processing module 26 for determining the value of (Pa,Na) is realized with a look-up table, that is, the corresponding (Pa,Na) are recorded as a table such as in FIG. 4. Furthermore, M is assumed even in FIG. 3–FIG. 5. If M is an odd number, when the digital input D is odd, S=M; but when the digital input D is even, S=(M+1) or S=(M−1).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-analog converter system, comprising:
    a common mode adjustment module, determining a first value S according to a digital input D;
    a pre-processing module, connecting to the common mode adjustment module for determining number of positive units which are turned on (Pa) and number of negative units which are turned on (Na) according to the first value S and the digital input D;
    a digital-analog converter circuit, comprising M three-level switch elements, each three-level switch element has a positive unit capable of supplying a unit of positive electricity and a negative unit capable of supplying a unit of negative electricity, the digital-analog converter circuit generates a corresponding analog output according to Pa and Na; and
    an assignment module, connecting to the pre-processing module and the digital-analog converter circuit for controlling the M three-level switch elements to supply positive or negative electricity in a predetermined order according to the first value S.

2. The digital-analog converter system of claim 1, wherein each three-level switch element supplies no electricity when the positive unit and the negative unit are both turned on or both turned off.

3. The digital-analog converter system of claim 1, further comprising a transistor that switches the positive unit and another transistor that switches the negative unit in each three-level switch element.

4. The digital-analog converter system of claim 1, wherein the number of the positive units which are turned on (Pa) and the number of the negative units which are turned on (Na) are determined according to Pa+Na=S and Pa−Na=D.

5. The digital-analog converter system of claim 1, wherein M is an even number, further comprising:
    the first value S equals M when the digital input D is even; and
    the first value S equals M+1 or M−1 when the digital input D is odd.

6. The digital-analog converter system of claim 1, wherein M is an odd number, further comprising:
    the first value S equals M when the digital input D is odd; and
    the first value S equals M+1 or M−1 when the digital input D is even.

7. The digital-analog converter system of claim 1, wherein the assignment module comprising:
    a first assignment circuit for turning on the positive units by increasing index progressively or by decreasing index progressively; and
    a second assignment circuit for turning on the negative units by decreasing index progressively or by increasing index progressively.

8. The digital-analog converter system of claim 1, wherein the digital-analog converter system is an over-sampling D/A converter system.

9. The digital-analog converter system of claim 1, wherein the digital-analog converter system is a sigma-delta converter.

10. A digital-analog converting method in a digital-analog converter system comprising M three-level switch elements, each three-level switch element has a positive unit capable of supplying a unit of positive electricity and a negative unit capable of supplying a unit of negative electricity, the method comprising:
    determining a first value S according to a digital input D;
    determining number of positive units which are turned on (Pa) and number of negative units which are turned on (Na) according to the first value S and the digital input D;
    controlling the M three-level switch elements to supply positive or negative electricity in a predetermined order according to the first value S; and
    generating a corresponding analog output according to Pa and Na.

11. The digital-analog converting method of claim 10, wherein each three-level switch element supplies no electricity when the positive unit and the negative unit are both turned on or both turned off.

12. The digital-analog converting method of claim 10, further comprising a transistor that switches the positive unit and another transistor that switches the negative unit in each three-level switch element.

13. The digital-analog converting method of claim 10, wherein the number of the positive units which are turned on (Pa) and the number of the negative units which are turned on (Na) are determined according to Pa+Na=S and Pa−Na=D.

14. The digital-analog converting method of claim 10, wherein M is an even number, further comprising:
    the first value S equals M when the digital input D is even; and
    the first value S equals M+1 or M−1 when the digital input D is odd.

15. The digital-analog converting method of claim 14, further comprising:
    when a preceding digital input D is an odd number and the first value S is M+1, on a next odd digital input D the first value S is M−1; or
    when the preceding digital input D is an odd number and the first value S is M−1, on a next odd digital input D the first value S is M+1.

16. The digital-analog converting method of claim 10, wherein M is an odd number, further comprising:
    the first value S equals M when the digital input D is odd; and
    the first value S equals M+1 or M−1 when the digital input D is even.

17. The digital-analog converting method of claim 16, further comprising:
    when a preceding digital input D is an even number and the first value S is M+1, on a next even digital input D the first value S is M−1; or
    when the preceding digital input D is an even number and the first value S is M−1, on a next even digital input D the first value S is M+1.

18. The digital-analog converting method of claim 10, further comprising:
    turning on the positive units by increasing index progressively and turning on the negative units by decreasing index progressively; or turning on the positive units by decreasing index progressively and turning on the negative units by increasing index progressively.

19. The digital-analog converting method of claim 10, wherein the digital-analog converter system is an oversampling D/A converter system.

20. The digital-analog converting method of claim 10, wherein the digital-analog converter system is a sigma-delta converter.

* * * * *